(12) United States Patent
Lee et al.

(10) Patent No.: US 7,894,296 B2
(45) Date of Patent: Feb. 22, 2011

(54) MULTI-PORT MEMORY DEVICES HAVING CLIPPING CIRCUITS THEREIN THAT INHIBIT DATA ERRORS DURING OVERLAPPING WRITE AND READ OPERATIONS

(75) Inventors: Chan-Ho Lee, Gyeonggi-do (KR); Dong-Wook Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 12/496,976

(22) Filed: Jul. 2, 2009

(65) Prior Publication Data

US 2010/0002531 A1 Jan. 7, 2010

(51) Int. Cl.
*G11C 7/12* (2006.01)
(52) U.S. Cl. ................ 365/230.05; 365/230.06; 365/184.04; 365/189.06
(58) Field of Classification Search ............ 365/230.05, 365/230.06, 184.04, 189.06
See application file for complete search history.

(56) References Cited

U.S. PATENT DOCUMENTS

| | | | | |
|---|---|---|---|---|
| 4,852,064 A | * | 7/1989 | Kim et al. ................ | 365/203 |
| 5,289,432 A | * | 2/1994 | Dhong et al. ............ | 365/230.05 |
| 5,335,199 A | * | 8/1994 | Aoyama ................ | 365/230.05 |
| 5,590,087 A | * | 12/1996 | Chung et al. ............ | 365/230.05 |
| 5,812,445 A | * | 9/1998 | Yamauchi ................ | 365/154 |
| 6,181,634 B1 | * | 1/2001 | Okita ................ | 365/230.05 |
| 6,816,955 B1 | * | 11/2004 | Raza et al. ............ | 711/168 |
| 6,917,536 B1 | * | 7/2005 | McLaury et al. ......... | 365/154 |
| 2003/0107913 A1 | * | 6/2003 | Nii ................ | 365/154 |

FOREIGN PATENT DOCUMENTS

| | | |
|---|---|---|
| KR | 1020020040111 A | 5/2002 |
| KR | 1020060052884 A | 5/2006 |

* cited by examiner

*Primary Examiner*—Hoai V Ho
*Assistant Examiner*—Jay Radke
(74) *Attorney, Agent, or Firm*—Myers Bigel Sibley & Sajovec

(57) ABSTRACT

An integrated circuit device includes a memory array having a multi-port memory cell (e.g., dual-port SRAM cell) therein. This multi-port memory cell includes at least first and second read/write ports, which may be provided by respective access transistors (e.g., N-type MOS transistors) that are responsive to word line signals. The first and second read/write ports are electrically coupled to the first and second bit lines, respectively. A first clipping circuit is also provided. The first clipping circuit is responsive to a first write control signal. The first clipping circuit is configured to bias the first bit line with a read blocking voltage during a first "overlapping" operation to write data from the second bit line into the multi-port memory cell concurrently with reading data from the multi-port memory cell onto the first bit line.

14 Claims, 6 Drawing Sheets

MULTI-PORT MEMORY DEVICES HAVING CLIPPING CIRCUITS THEREIN THAT INHIBIT DATA ERRORS DURING OVERLAPPING WRITE AND READ OPERATIONS

REFERENCE TO PRIORITY APPLICATION

This application claims the benefit of Korean Patent Application No. 10-2008-0063793, filed Jul. 2, 2008, the contents of which are incorporated herein by reference.

BACKGROUND

A multi-port semiconductor memory device uses a plurality of ports for individually accessing a plurality of memory cells therein. In a multi-port semiconductor memory device, at least two ports may be simultaneously used to access one memory cell, during a read operation and a write operation. Such simultaneous access can cause an address contention. When the address contention is caused in the multi-port semiconductor memory device, interference between the at least two ports may occur. As a result, operations of the multi-port semiconductor memory device may fail because the interference may cause data errors. For example, when a first port is used for a read operation and a second port is used for a write operation, the read operation on the first port may cause errors during the write operation on the second port.

SUMMARY

An integrated circuit device according to embodiments of the invention includes a memory array having a multi-port memory cell (e.g., dual-port SRAM cell) therein. This multi-port memory cell includes at least first and second read/write ports, which may be provided by respective access transistors (e.g., N-type MOS transistors) that are responsive to word line signals. The first and second read/write ports are electrically coupled to the first and second bit lines, respectively. A first clipping circuit is also provided. The first clipping circuit is responsive to a first write control signal. The first clipping circuit is configured to bias the first bit line with a read blocking voltage during a first "overlapping" operation to write data from the second bit line into the multi-port memory cell concurrently with reading data from the multi-port memory cell onto the first bit line. This read blocking voltage has a magnitude sufficient to inhibit disturbance of data stored in the multi-port memory cell when first and second read/write ports are concurrently enabled during the first overlapping operation. Moreover, during this operation, the first and second bit lines are electrically coupled, via the first and second read/write ports, to a storage node within the multi-port memory cell. According to further aspects of these embodiments of the invention, a second clipping circuit is provided, which is responsive to a second write control signal. The second clipping circuit is configured to bias the second bit line with a read blocking voltage during a second overlapping operation to write data from the first bit line into the multi-port memory cell and read data from the multi-port memory cell onto the second bit line.

According to additional embodiments of the invention, the first clipping circuit may include a first level shifting transistor configured as a first diode so that the read blocking voltage is less than a power supply voltage (Vdd). In particular, the read blocking voltage may be less than the power supply voltage by an amount equivalent to a threshold voltage of the first level shifting transistor and a cathode of the first diode may be electrically connected to the first bit line. The first clipping circuit may also include a first pull-up transistor having a gate terminal responsive to the first write control signal and a drain terminal electrically connected to an anode of the first diode.

An integrated circuit memory device according to additional embodiments of the invention includes a dual-port SRAM cell along with first and second clipping circuits. The SRAM cell includes a first read/write port electrically coupled to a first pair of differential bit lines and a second read/write port electrically coupled to a second pair of differential bit lines. The first clipping circuit is configured to drive the first pair of differential bit lines with read blocking voltages during a first overlapping operation to write differential data from the second pair of differential bit lines into the dual-port SRAM cell and read data from the dual-port SRAM cell onto the first pair of differential bit lines. Similarly, the second clipping circuit is configured to drive the second pair of differential bit lines with read blocking voltages during a second overlapping operation to write differential data from the first pair of differential bit lines into the dual-port SRAM cell and read data from the dual-port SRAM cell onto the second pair of differential bit lines.

According to some of these embodiments of the invention, the first clipping circuit includes first and second pull-up transistors, which have gate terminals responsive to a first write control signal, and first and second level shifting transistors. The first write control signal is driven high-to-low during the operation to read data from the dual-port SRAM cell onto the first pair of differential bit lines. The first level shifting transistor is configured as a first diode having an anode electrically coupled to a drain terminal of the first pull-up transistor and a cathode electrically coupled to a first one of the first pair of differential bit lines. The second level shifting transistor is configured as a second diode having an anode electrically coupled to a drain terminal of said second pull-up transistor and a cathode electrically coupled to a second one of the first pair of differential bit lines.

Additional embodiments of the invention include methods of operating a multi-port memory device by writing first data through first ports of first row of multi-port memory cells at a first row address in the memory device, in response to a write instruction received by the memory device. This writing operation also includes driving second ports of the first row of multi-port memory cells with read blocking voltages having magnitudes sufficient to inhibit disturbance of data stored in the first row of multi-port memory cells, during an overlapping operation to read the first row of multi-port memory cells through the second ports in response to a read instruction received by the memory device. This driving of the second ports with the read blocking voltages prevents the operation to read the first row of multi-port memory cells through the second ports from commencing at least until the writing of first data through the first ports is complete.

DETAILED DESCRIPTION OF THE EMBODIMENTS

Figure 1:
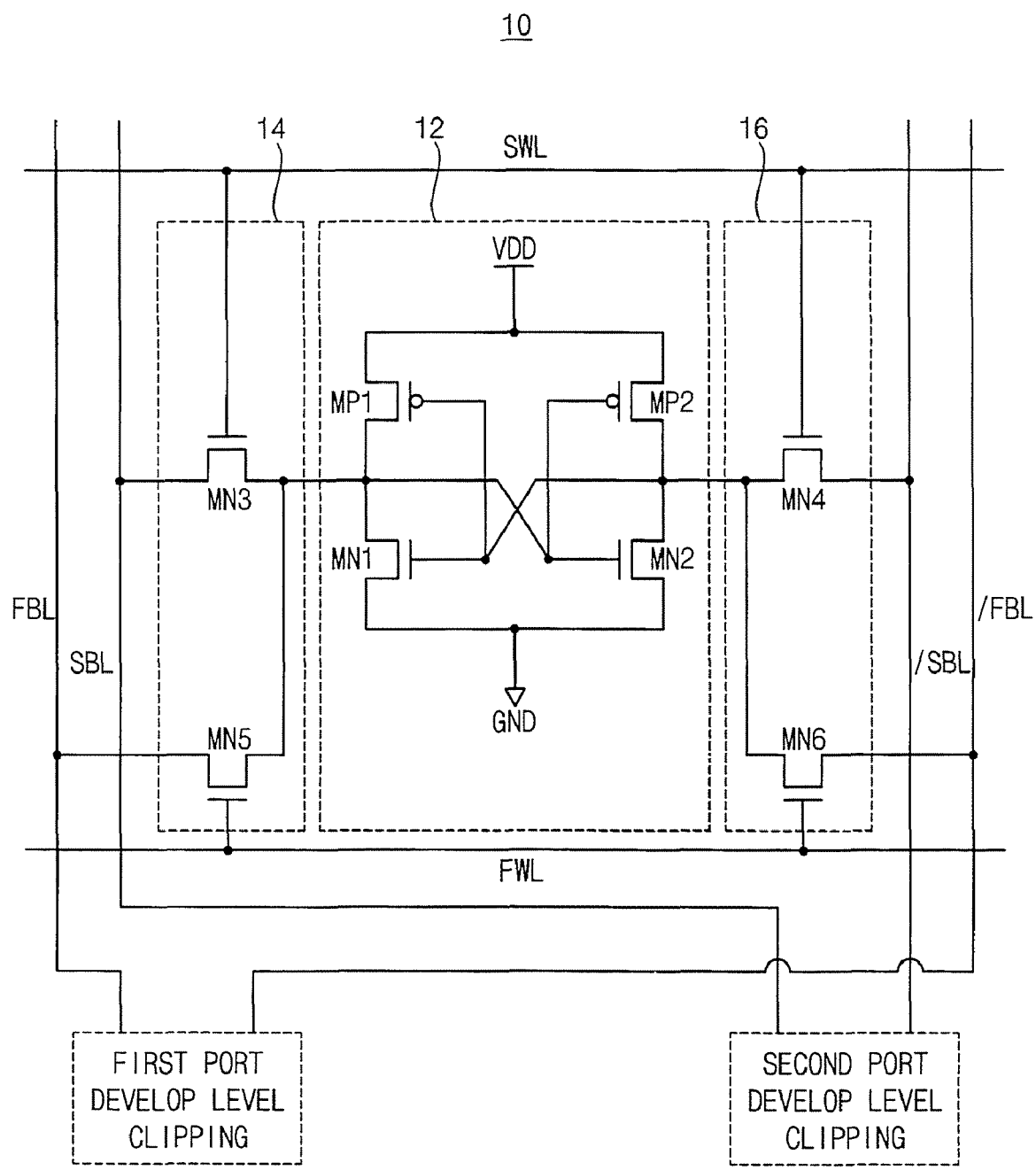
FIG. 1 is a circuit diagram illustrating a multi-port static random access memory (SRAM) cell.

Various example embodiments will be described more fully with reference to the accompanying drawings, in which embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a multi-port static random access memory (SRAM) cell.

Referring to FIG. 1, the multi-port SRAM cell 10 may include a latch circuit 12 having four transistors MN1, MP1, MN2, and MP2, a first switching circuit 14 having two transistors MN3 and MN5, and a second switching circuit 16 having two transistors MN4 and MN6.

The first switching circuit 14 and the second switching circuit 12 are used to write data into the latch circuit 12 or to read data from the latch circuit 12. For example, when data is read or written using a first bitline pair FBL and /FBL, a voltage having a logic "high" level is applied into a first wordline FWL, and a voltage having a logic "low" level is applied into a second wordline SWL. Similarly, when data is read or written using a second bitline pair SBL and /SBL, a voltage having a logic "low" level is applied into the first wordline FWL and a voltage having a logic "high" level is applied into the second wordline SWL. Thus, a read operation through a first port coupled to the first bitline pair FBL and /FBL may have a bad influence upon a write operation through a second port coupled to the second bitline pair SBL and /SBL if an address contention in which the first port and the second port access one memory cell simultaneously is caused in a multi-port semiconductor memory device.

The example embodiments may prevent interferences between at least two ports (e.g. the first port coupled to the first bitline pair FBL and /FBL and the second port coupled to the second bitline pair SBL and /SBL) by clipping a develop-level of the first bitline pair FBL and /FBL or the second bitline pair SBL and /SBL when the read operation is performed on the first bitline pair FBL and /FBL or the second bitline pair SBL and /SBL. That is, the example embodiments may prevent interferences between at least two ports (e.g. the first port coupled to the first bitline pair FBL and /FBL and the second port coupled to the second bitline pair SBL and /SBL) by preventing the develop-level of the first bitline pair FBL and /FBL or the second bitline pair SBL and /SBL from dropping below a predetermined clipping level when the address contention is caused. For example, the write operation on the second bitline pair SBL and /SBL may not be influenced by the read operation on the first bitline pair FBL and /FBL by clipping the develop-level of the first bitline pair FBL and /FBL. Similarly, the write operation on the first bitline pair FBL and /FBL may not be influenced by the read operation on the second bitline pair SBL and /SBL by clipping the develop-level of the second bitline pair SBL and /SBL.

Figure 2:
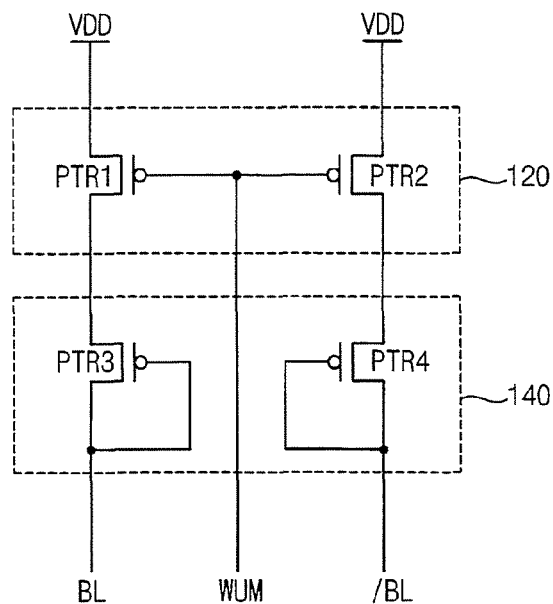
FIG. 2 is a circuit diagram illustrating a develop-level clipping circuit according to an example embodiment.

FIG. 2 is a circuit diagram illustrating a develop-level clipping circuit according to an example embodiment.

Referring to FIG. 2, the develop-level clipping circuit 100 may include a first block 120 and a second block 140.

The first block 120 is coupled to a power voltage VDD. The first block 120 blocks the power voltage VDD when a write control signal WUM is activated, and supplies the power voltage VDD when the write control signal WUM is deactivated. The first block 120 may include a first P-type metal oxide semiconductor (PMOS) transistor PTR1 and a second PMOS transistor PTR2. The first PMOS transistor PTR1 and the second PMOS transistor PTR2 perform function as switches that couple the power voltage VDD to a bitline pair BL and /BL through the second block 140. The first block 120 receives the write control signal WUM through gate terminals of the first PMOS transistor PTR1 and the second PMOS transistor PTR2. If the first block 120 includes a first N-type metal oxide semiconductor (NMOS) transistor and a second NMOS transistor instead of the first PMOS transistor and the second PMOS transistor, the first block 120 may receive an inverted signal of the write control signal WUM through gate terminals of the first NMOS transistor and the second NMOS transistor.

The second block 140 is coupled between the first block 120 and the bitline pair BL and /BL. The second block 140 clips a develop-level of the bitline pair BL and /BL when the power voltage VDD is supplied through the first block 120. The second block 140 may include a third PMOS transistor PTR3 and a fourth PMOS transistor PTR4. The third PMOS transistor PTR3 and the fourth PMOS transistor PTR4 perform function as clipping elements that prevent the develop-level of the bitline pair BL and /BL from dropping below a predetermined clipping level.

As illustrated in FIG. 2, a first terminal of the first PMOS transistor PTR1 and a first terminal of the second PMOS transistor PTR2 are coupled to the power voltage VDD. A gate terminal of the first PMOS transistor PTR1 and a gate terminal of the second PMOS transistor PTR2 are coupled to each other, and receive the write control signal WUM. A second terminal of the first PMOS transistor PTR1 and a second terminal of the second PMOS transistor PTR2 are coupled to a first terminal of the third PMOS transistor PTR3 and a first terminal of the fourth PMOS transistor PTR4 respectively. In addition, a gate terminal of the third PMOS transistor PTR3 is coupled to the bitline BL, and a gate terminal of the fourth PMOS transistor PTR4 is coupled to a complementary bitline /BL. A second terminal of the third PMOS transistor PTR3 and a second terminal of the fourth PMOS transistor PTR4 are coupled to the bitline BL and the complementary bitline /BL, respectively.

When the write control signal WUM is deactivated (e.g., a logic "low" level), the first PMOS transistor PTR1 and the second PMOS transistor PTR2 are turned on. In this case, the third PMOS transistor PTR3 and the fourth PMOS transistor PTR4 may clip the develop-level of the bitline pair BL and /BL. That is, the third PMOS transistor PTR3 and the fourth PMOS transistor PTR4 may clip the develop-level of the bitline pair BL and /BL, so that the develop-level of the bitline pair BL and /BL may not drop below a voltage level VDD−|Vtp|. Here, Vtp denotes a threshold voltage of the PMOS transistors PTR3 and PTR4. The develop-level of the bitline pair BL and /BL may be changed by adjusting sizes of transistors in the first block 120 and the second block 140.

On the other hand, when the write control signal WUM is activated (e.g., a logic "high" level), the first PMOS transistor PTR1 and the second PMOS transistor PTR2 are turned off. In this case, the third PMOS transistor PTR3 and the fourth PMOS transistor PTR4 may not clip the develop-level of the bitline pair BL and /BL. That is, a first current path through the first PMOS transistor PTR1 and the third PMOS transistor PTR3, and a second current path through the second PMOS transistor PTR2 and the fourth PMOS transistor PTR4 may not be formed, so that the develop-level clipping circuit 100 may not influence on voltages of the bitline pair BL and /BL during the write operation.

Figure 3:
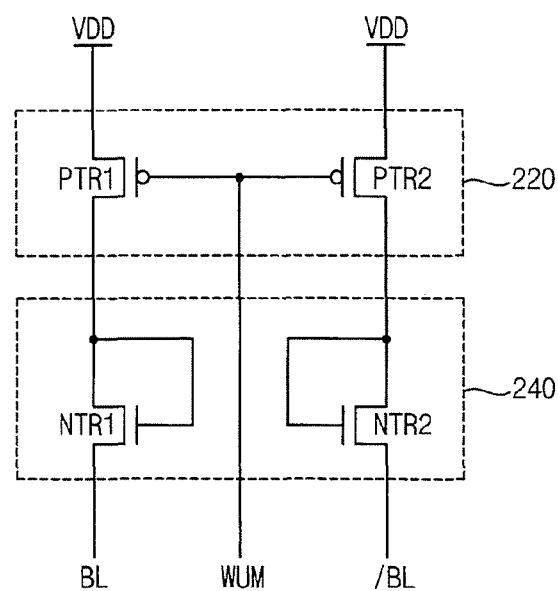
FIG. 3 is a circuit diagram illustrating a develop-level clipping circuit according to another example embodiment.

FIG. 3 is a circuit diagram illustrating a develop-level clipping circuit according to another example embodiment.

Referring to FIG. 3, the develop-level clipping circuit 200 may include a first block 220 and a second block 240.

The first block 220 is coupled to a power voltage VDD. The first block 220 blocks the power voltage VDD when a write control signal WUM is activated, and supplies the power voltage VDD when the write control signal WUM is deactivated. The first block 220 may include a first PMOS transistor PTR1 and a second PMOS transistor PTR2. The first PMOS transistor PTR1 and the second PMOS transistor PTR2 serve as switches that couple the power voltage VDD to a bitline pair BL and /BL through the second block 240. The first block 220 receives the write control signal WUM through gate terminals of the first PMOS transistor PTR1 and the second PMOS transistor PTR2. If the first block 220 includes a first NMOS transistor and a second NMOS transistor instead of the first PMOS transistor and the second PMOS transistor, the first block 220 may receive an inverted signal of the write control signal WUM through gate terminals of the first NMOS transistor and the second NMOS transistor.

The second block 240 is coupled between the first block 220 and the bitline pair BL and /BL. The second block 240 clips a develop-level of the bitline pair BL and /BL when the power voltage VDD is supplied through the first block 220. The second block 240 may include a first NMOS transistor NTR1 and a second NMOS transistor NTR2. The first NMOS transistor NTR1 and the second NMOS transistor NTR2 serve as clipping elements that prevent the develop-level of the bitline pair BL and /BL from dropping below a predetermined clipping level.

As illustrated in FIG. 3, a first terminal of the first PMOS transistor PTR1 and a first terminal of the second PMOS transistor PTR2 are coupled to the power voltage VDD. A gate terminal of the first PMOS transistor PTR1 and a gate terminal of the second PMOS transistor PTR2 are coupled to each other, and receive the write control signal WUM. A second terminal of the first PMOS transistor PTR1 and a second terminal of the second PMOS transistor PTR2 are coupled to a first terminal of the first NMOS transistor NTR1 and a first terminal of the second NMOS transistor NTR2 respectively. A gate terminal of the first NMOS transistor NTR1 and a gate terminal of the second NMOS transistor NTR2 are coupled to the second terminal of the first PMOS transistor PTR1 and the second terminal of the second PMOS transistor PTR2 respectively. A second terminal of the first NMOS transistor NTR1 and a second terminal of the second NMOS transistor NTR2 are coupled to the bitline BL and the complementary bitline /BL, respectively.

When the write control signal WUM is deactivated (e.g., a logic "low" level), the first PMOS transistor PTR1 and the second PMOS transistor PTR2 are turned on. In this case, the first NMOS transistor NTR1 and the second NMOS transistor NTR2 may clip the develop-level of the bitline pair BL and /BL. That is, the first NMOS transistor NTR1 and the second NMOS transistor NTR2 may clip the develop-level of the bitline pair BL and /BL, so that the develop-level of the bitline pair BL and /BL may not drop below a voltage level VDD−|Vtn|. Here, Vtn denotes a threshold voltage of the NMOS transistors NTR1 and NTR2. The develop-level of the bitline pair BL and /BL may be changed by adjusting sizes of transistors in the first block 220 and the second block 240.

On the other hand, when the write control signal WUM is activated (e.g., a logic "high" level), the first PMOS transistor PTR1 and the second PMOS transistor PTR2 are turned off. In this case, the first NMOS transistor NTR1 and the second NMOS transistor NTR2 may not clip the develop-level of the bitline pair BL and /BL. That is, a first current path through the first PMOS transistor PTR1 and the first NMOS transistor NTR1, and a second current path through the second PMOS transistor PTR2 and the second NMOS transistor NTR2 may not be formed, so that the develop-level clipping circuit 100 may not influence on voltages of the bitline pair BL and /BL during the write operation.

Figure 4:
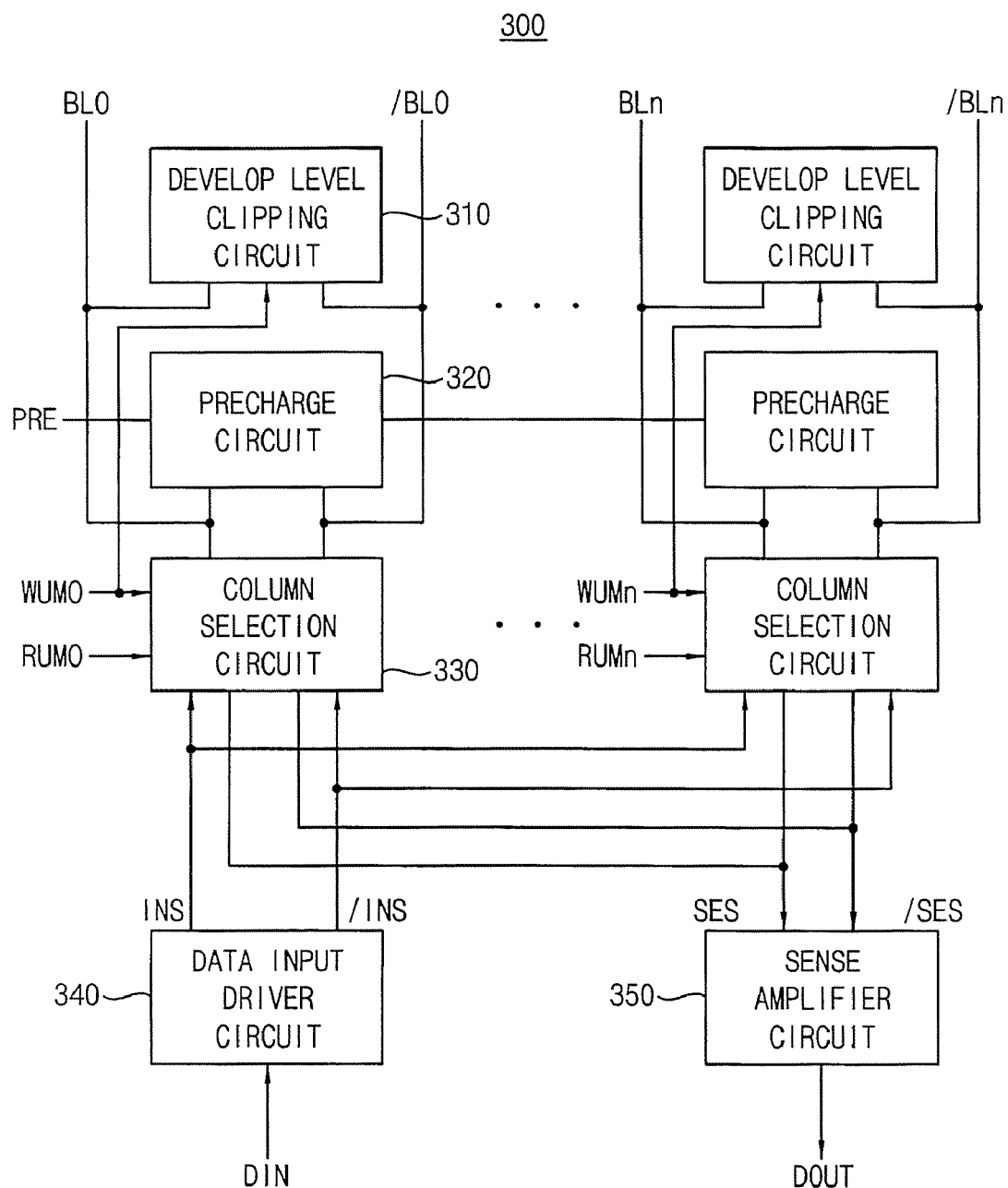
FIG. 4 is a block diagram illustrating a column path circuit according to an example embodiment.

FIG. 4 is a block diagram illustrating a column path circuit according to an example embodiment.

Referring to FIG. 4, the column path circuit 300 may include a develop-level clipping circuit 310, a precharge circuit 320, a column selection circuit 330, a data input driver circuit 340, and a sense amplifier circuit 350.

The develop-level clipping circuit 310 includes a first block and a second block as illustrated in FIGS. 2 and 3. The first block is coupled to a power voltage VDD. The first block blocks the power voltage VDD when write control signals WUM0 through WUMn are activated, and supplies the power voltage VDD when the write control signals WUM0 through WUMn are deactivated. The first block serve as a switch that couples the power voltage VDD to bitline pairs BL0 and /BL0 through BLn and /BLn through the second block. The second block is coupled between the first block and the bitline pairs BL and /BL through BLn and /BLn. The second block clips develop-levels of the bitline pairs BL and /BL through BLn and /BLn when the power voltage VDD is supplied through the first block. That is, the develop-level clipping circuit 310 clips the develop-levels of the bitline pairs BL0 and /BL0 through BLn and /BLn when the write control signals WUM0 through WUMn are deactivated. Thus, the develop-level clipping circuit 310 may prevent a write operation through one port from being influenced by a read operation through another port even when an address contention is caused in a multi-port semiconductor memory device. Hereinafter, operations of a precharge mode, a read mode, and a write mode will be described in detail referring to one bitline pair BL0 and /BL0 among bitline pairs BL0 and /BL0 through BLn and /BLn, one write control signal among write control signals WUM0 through WUMn, and one read control signal among read control signals RUM0 through RUMn.

In the precharge mode, the precharge circuit 320 precharges the bitline pair BL0 and /BL0 up to a level of the power voltage VDD responding to a precharge signal PRE to prepare a read operation. The bitline pair BL0 and /BL0 is precharged up to the level of the power voltage VDD as PMOS transistors in the precharge circuit 320 turn on responding to the precharge signal PRE having a logic "low" level. The precharge operation is finished as the PMOS transistors in the precharge circuit 320 turn off responding to the precharge signal PRE having a logic "high" level.

In the read mode, the column selection circuit 320 couples the bitline pair BL0 and /BL0 to the sense amplifier circuit 350 responding to the read control signal RUM0. After one of memory cells is selected as one of read wordlines is activated (e.g., a logic "high" level), the bitline pair BL0 and /BL0 precharged up to the level of the power voltage VDD begins to be developed according to dada DAT and complementary data /DAT stored in the one of the memory cells. Then, when a voltage level of the bitline BL0 or the complementary bitline /BL0 become a predetermined clipping level (e.g., VDD−|Vtnl|), the sense amplifier circuit 350 coupled to the bitline pair BL0 and /BL0 by the column selection circuit 330 detects and amplifies a voltage difference SES and /SES on the bitline pair BL0 and /BL0 responding to the read control signal RUM0 to output data DOUT.

In the write mode, the column selection circuit 320 couples the bitline pair BL0 and /BL0 to the data input driver circuit 340 responding to the write control signal WUM0. The data input driver circuit 340 receives data DIN from outside, and applies an input data signal pair INS and /INS into the bitline pair BL0 and /BL0 responding to the write control signal WUM0 to write the data DIN into a memory cell. That is, the input data signal pair INS and /INS is applied into the bitline pair BL0 and /BL0 as the data DIN. After one of memory cells is selected as one of write wordlines is activated (e.g., a logic "high" level), the input data signal pair INS and /INS applied into the bitline pair BL0 and /BL0 are stored as a data DAT and a complementary data /DAT in the one of the memory cells.

As described above, in the read mode, the column path circuit 300 may prevent inferences between at least two ports due to the address contention by clipping the bitline pairs BL0 and /BL0 through BLn and /BLn. That is, the column path circuit 300 may prevent the develop-level of the bitline pairs BL0 and /BL0 through BLn and /BLn from dropping below a predetermined clipping level (e.g., VDD−|Vtp|). In addition, in the write mode, the column path circuit 300 may apply voltages having required levels into the bitline pairs BL0 and /BL0 through BLn and /BLn because the bitline pairs BL0 and /BL0 through BLn and /BLn are not clipped during the write operation.

Figure 5:
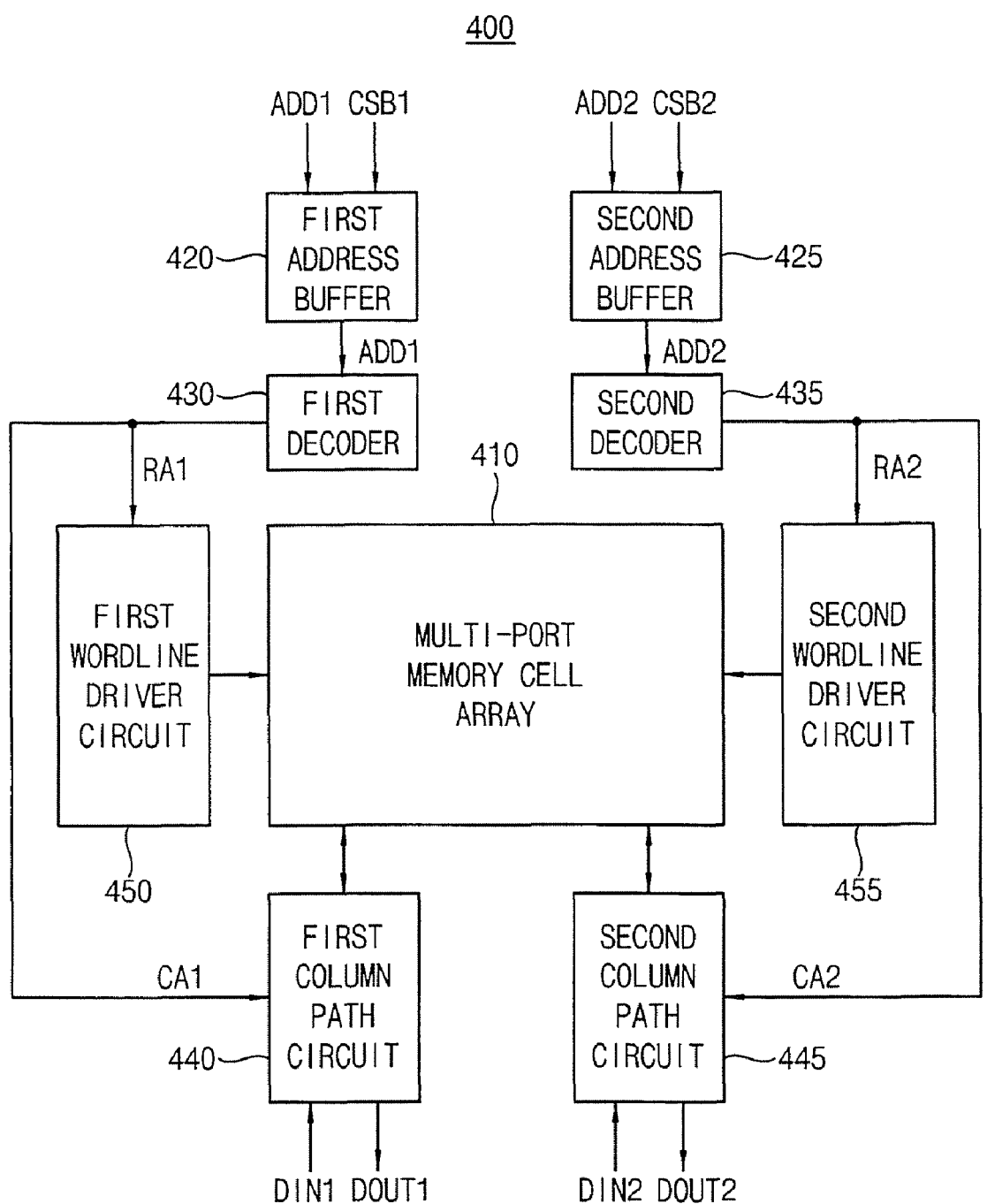
FIG. 5 is a block diagram illustrating a multi-port semiconductor memory device according to an example embodiment.

FIG. 5 is a block diagram illustrating a multi-port semiconductor memory device according to an example embodiment.

Referring to FIG. 5, the multi-port semiconductor memory device 400 may include a multi-port memory cell array 410, a first address buffer 420, a first decoder 430, a first column path circuit 440, a first wordline driver circuit 450, a second address buffer 425, a second decoder 435, a second column path circuit 445, and a second wordline driver circuit 455.

The multi-port memory cell array 410 has a first port and a second port. The first address buffer 420 provides a first address ADD1 relating to the first port to the first decoder 430 based on a first chip selection signal CSB1. The first decoder 430 decodes the first address ADD1 provided from the first address buffer 420, and outputs a first row address signal RA1 and a first column address signal CA1 to the first wordline driver circuit 450 and the first column path circuit 440, respectively. The first wordline driver circuit 450 receives the first row address signal RA1, and selects a first wordline relating to the first port. The first column path circuit 440 receives the first column address signal CA1, and selects a first bitline pair relating to the first port. The second address buffer 425 provides a second address ADD2 relating the second port to the second decoder 435 based on a second chip selection signal CSB2. The second decoder 435 decodes the second address ADD2 provided from the second address buffer 425, and outputs a second row address signal RA2 and a second column address signal CA2 to the second wordline driver circuit 455 and the second column path circuit 445, respectively. The second wordline driver circuit 455 receives the second row address signal RA2, and selects a second wordline relating to the second port. The second column path circuit 445 receives the second column address signal CA2, and selects a second bitline pair relating to the second port.

Each of the first column path circuit 440 and the second column path circuit 445 includes a sense amplifier circuit that detects and amplifies a voltage difference of a bitline pair responding to a read control signal to output data DOUT1 and DOUT2, a data input driver circuit that applies data DIN1 and DIN2 inputted from outside into the bitline pair responding to a write control signal, a precharge circuit that precharges the bitline pair responding to a precharge signal, a column selection circuit that couples the bitline pair to the sense amplifier circuit responding to the read control signal, and couples the bitline pair to the data input driver circuit responding to the write control signal, and a develop-level clipping circuit that clips a develop-level of the bitline pair to prevent the develop-level of the bitline pair from dropping below a predetermined clipping level.

The operation of the multi-port semiconductor memory device 400 will be described below. The first address buffer 420 receives a first address ADD1 and a first chip selection signal CSB1. The second address buffer 425 receives a second address ADD2 and a second chip selection signal CSB2. When the first chip selection signal CSB1 is activated, the first address buffer 420 buffers the first address ADD1. When the second chip selection signal CSB2 is activated, the second address buffer 425 buffers the second address ADD2. The first decoder 430 decodes the first address ADD1 provided from the first address buffer 420 to output the first row address signal RA1 and the first column address signal CA1. The second decoder 435 decodes the second address ADD2 provided from the second address buffer 425 to output the second row address signal RA2 and the second column address signal CA2. The first wordline driver circuit 450 determines one of wordlines based on the first row address signal RA1. The first column path circuit 440 determines one of bitline pairs based on the first column address signal CA1. Then, one memory cell in the memory cell array 410 is selected for the read operation or the write operation. Similarly, the second wordline driver circuit 455 determines one of wordlines based on the second row address signal RA2. The second column path circuit 445 determines one of bitline pairs based on the second column address signal CA2. Then, one memory cell in the memory cell array 410 is selected for the read operation or the write operation. The operation of the multi-port semiconductor memory device 400 may be variously changed without departing from the scope of the invention.

Figure 6:
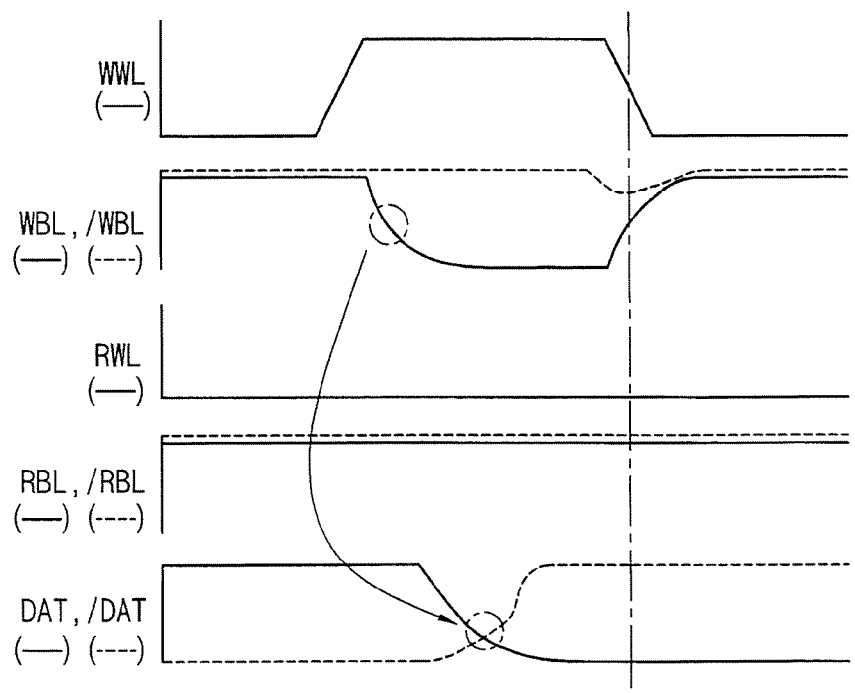
FIG. 6 is a timing diagram illustrating an example operation in which an address contention is not caused in conventional multi-port semiconductor memory device.

FIG. 6 is a timing diagram illustrating an example operation in which an address contention is not caused in conventional multi-port semiconductor memory device.

Referring to FIG. 6, a voltage having a logic "low" level is applied into a read wordline RWL while a voltage having a logic "high" level is applied into a write wordline WWL. That is, a read bitline pair RBL and /RBL is not developed during a write operation. Thus, data applied into a write bitline pair WBL and /WBL may be successfully stored in a memory cell as data DAT and complementary data /DAT.

Figure 7:
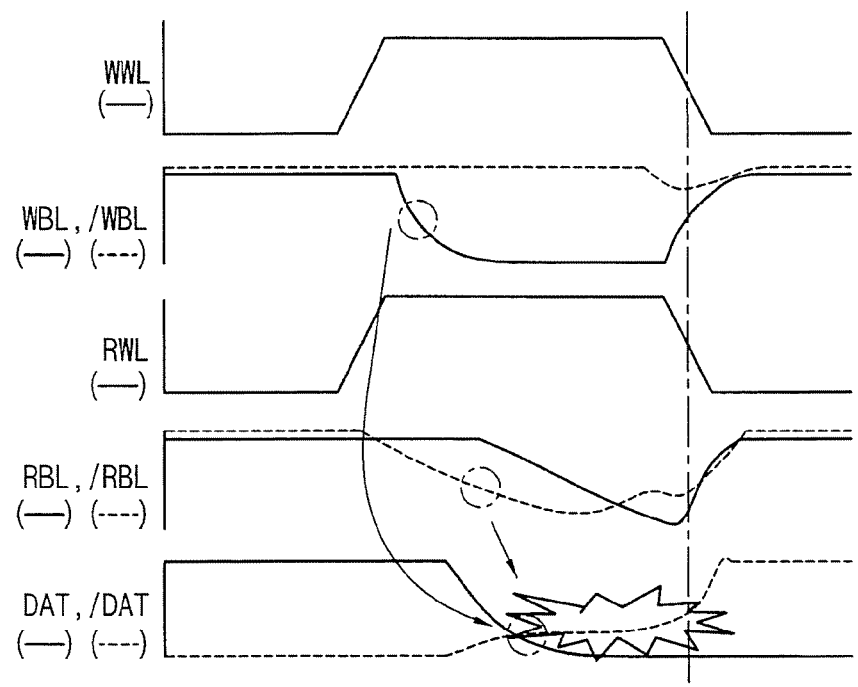
FIG. 7 is a timing diagram illustrating an example operation in which an address contention is caused in conventional multi-port semiconductor memory device.

FIG. 7 is a timing diagram illustrating an example operation in which an address contention is caused in conventional multi-port semiconductor memory device.

Referring to FIG. 7, a voltage having a logic "high" level is applied into a read wordline RWL while a voltage having a logic "high" level is applied into a write wordline WWL. That is, a read bitline pair RBL and /RBL is developed by a data pair DAT and /DAT stored in a memory cell during a write operation. Here, if the complementary read bitline /RBL is largely developed towards a voltage corresponding to a logic "low" level, due to inferences of the complementary read bitline /RBL, it takes a long time that the complementary data /DAT is charged to a voltage having a logic "high" level during the write operation. That is, a memory cell may experience a write operation in which a voltage having a logic "low" level is applied into both of the write bitline WBL and the complementary write bitline /WBL. Thus, the write operation may be failed if a relatively short period is given for the write operation because the complementary data /DAT may not have a logic "high" level successfully.

Figure 8:
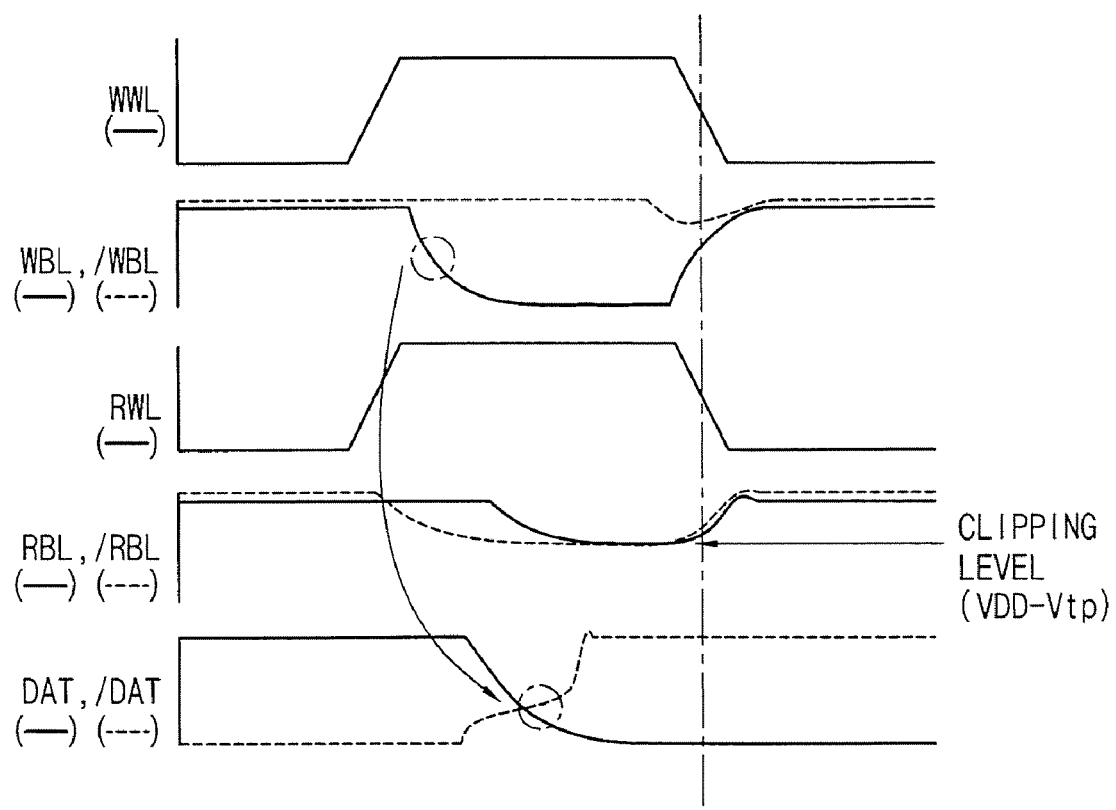
FIG. 8 is a timing diagram illustrating an example operation in which an address contention is caused in the multi-port semiconductor memory device of FIG. 5.

FIG. 8 is a timing diagram illustrating an example operation in which an address contention is caused in the multi-port semiconductor memory device of FIG. 5.

Referring to FIG. 8, a voltage having a logic "high" level is applied into a read wordline RWL while a voltage having a logic "high" level is applied into a write wordline WWL. That is, a read bitline pair RBL and /RBL is developed by a data pair DAT and /DAT stored in a memory cell during a write operation. However, a voltage level of the read bitline pair RBL and /RBL does not drop below a predetermined clipping level VDD−|Vtp|because a develop-level clipping circuit of the present invention clips a develop-level of the read bitline pair RBL and /RBL to the predetermined clipping level VDD−|Vtp|. Thus, the complementary data /DAT may be promptly charged to a voltage having a logic "high" level during the write operation. In result, the write operation may be performed successfully even when an address contention is caused in the multi-port semiconductor memory device of FIG. 5.

As described above, referring to a multi-port SRAM cell having eight transistors as one example, a develop-level clipping circuit, a column path circuit, and a multi-port semiconductor memory device according to example embodiments are described in detail. However, the develop-level clipping circuit, the column path circuit, and the multi-port semiconductor memory device described above are just example, so that various changes, substitutions and alterations may be made without departing from the scope of the invention. In addition, the develop-level clipping circuit, the column path circuit, and the multi-port semiconductor memory device according to example embodiments may be applicable to an electronic device using a semiconductor memory device such as a computer, a notebook, a cellular phone, etc.

Moreover, integrated circuit devices according to embodiments of the invention may be further described herein as including a memory array having a multi-port memory cell 10 (e.g., dual-port SRAM cell) therein. This multi-port memory cell 10 includes at least first and second read/write ports, which may be provided by respective access transistors (e.g., N-type MOS transistor pairs MN3, MN4 and MN5, MN6) that are responsive to word line signals (FWL, SWL). The first and second read/write ports are electrically coupled to the first and second bit lines (e.g., FBL, SBL), respectively. A first clipping circuit 100 is also provided. The first clipping circuit is responsive to a first write control signal WUM. The first clipping circuit 100 is configured to bias the first bit line FBL with a read blocking voltage during a first "overlapping" operation to write data from the second bit line SBL into the multi-port memory cell 10 concurrently with reading data from the multi-port memory cell 10 onto the first bit line FBL. This read blocking voltage has a magnitude (e.g., VDD−|Vtn|) sufficient to inhibit disturbance of data stored in the multi-port memory cell 10 when first and second read/write ports (MN3, MN4) (MN5, MN6) are concurrently enabled during the first overlapping operation. Moreover, during this operation, the first and second bit lines FBL, SBL are electrically coupled, via the first and second read/write ports, to a storage node (e.g., inverter output) within the multi-port memory cell 10. According to further aspects of these embodiments of the invention, a second clipping circuit is provided, which is responsive to a second write control signal. The second clipping circuit is configured to bias the second bit line with a read blocking voltage during a second overlapping operation to write data from the first bit line into the multi-port memory cell and read data from the multi-port memory cell onto the second bit line.

According to additional embodiments of the invention, the first clipping circuit may include a first level shifting transistor (e.g., PTR3) configured as a first diode so that the read blocking voltage is less than a power supply voltage (Vdd). In particular, the read blocking voltage may be less than the power supply voltage by an amount equivalent to a threshold voltage of the first level shifting transistor (e.g., PTR3) and a cathode of the first diode may be electrically connected to the first bit line BL. The first clipping circuit may also include a first pull-up transistor (e.g., PTR1) having a gate terminal responsive to the first write control signal WUM and a drain terminal electrically connected to an anode of the first diode (e.g., PTR3).

An integrated circuit memory device according to additional embodiments of the invention includes a dual-port SRAM cell 10 along with first and second clipping circuits 310. The SRAM cell includes a first read/write port electrically coupled to a first pair of differential bit lines FBL/FBL and a second read/write port electrically coupled to a second pair of differential bit lines SBL/SBL. The first clipping circuit 310, 100 is configured to drive the first pair of differential bit lines with read blocking voltages (e.g., VDD−|Vtn|) during a first overlapping operation to write differential data from the second pair of differential bit lines into the dual-port SRAM cell 10 and read data from the dual-port SRAM cell 10 onto the first pair of differential bit lines. Similarly, the second clipping circuit 310, 100 is configured to drive the second pair of differential bit lines with read blocking voltages during a second overlapping operation to write differential data from the first pair of differential bit lines into the dual-port SRAM cell 10 and read data from the dual-port SRAM cell 10 onto the second pair of differential bit lines.

While the example embodiments and their advantages have been described in detail, it should be understood that various changes, substitutions and alterations may be made herein without departing from the scope of the invention.

What is claimed is:

1. An integrated circuit device, comprising:
   a memory array having a multi-port memory cell therein electrically coupled to a first bit line associated with a first read/write port and a second bit line associated with a second read/write port; and
   a first clipping circuit responsive to a first write control signal, said first clipping circuit configured to bias the first bit line with a read blocking voltage during a first overlapping operation to write data from the second bit line into the multi-port memory cell and read data from the multi-port memory cell onto the first bit line.

2. The integrated circuit device of claim 1, wherein the read blocking voltage has a magnitude sufficient to inhibit disturbance of data stored in the multi-port memory cell when first and second read/write ports are concurrently enabled during the first overlapping operation, and wherein the first and second bit lines are electrically coupled to a storage node within the multi-port memory cell during the first overlapping operation.

3. The integrated circuit device of claim 1, further comprising a second clipping circuit responsive to a second write control signal, said second clipping circuit configured to bias the second bit line with a read blocking voltage during a second overlapping operation to write data from the first bit line into the multi-port memory cell and read data from the multi-port memory cell onto the second bit line.

4. The integrated circuit device of claim 1, wherein said first clipping circuit comprises a first level shifting transistor configured as a first diode; and wherein the read blocking voltage is less than a power supply voltage supplied to said first clipping circuit by an amount equivalent to a threshold voltage of the first level shifting transistor, and wherein a cathode of the first diode is electrically connected to the first bit line.

5. The integrated circuit device of claim 4, wherein said first clipping circuit further comprises a first pull-up transistor having a gate terminal responsive to the first write control signal and a drain terminal electrically connected to an anode of the first diode.

6. The integrated circuit device of claim 5, further comprising a second clipping circuit responsive to a second write control signal, said second clipping circuit configured to bias the second bit line with a read blocking voltage during a second overlapping operation to write data from the first bit line into the multi-port memory cell and read data from the multi-port memory cell onto the second bit line.

7. An integrated circuit memory device, comprising:
   a dual-port SRAM cell comprising a first read/write port electrically coupled to a first pair of differential bit lines and a second read/write port electrically coupled to a second pair of differential bit lines;
   a first clipping circuit configured to drive the first pair of differential bit lines with read blocking voltages during a first overlapping operation to write differential data from the second pair of differential bit lines into said dual-port SRAM cell and read data from said dual-port SRAM cell onto the first pair of differential bit lines; and
   a second clipping circuit configured to drive the second pair of differential bit lines with read blocking voltages during a second overlapping operation to write differential data from the first pair of differential bit lines into said dual-port SRAM cell and read data from said dual-port SRAM cell onto the second pair of differential bit lines.

8. The memory device of claim 7, wherein said first clipping circuit comprises:
   first and second pull-up transistors having gate terminals responsive to a first write control signal;
   a first level shifting transistor configured as a first diode having an anode electrically coupled to a drain terminal of said first pull-up transistor and a cathode electrically coupled to a first one of the first pair of differential bit lines; and
   a second level shifting transistor configured as a second diode having an anode electrically coupled to a drain terminal of said second pull-up transistor and a cathode electrically coupled to a second one of the first pair of differential bit lines.

9. The memory device of claim 8, wherein the first write control signal is driven high-to-low during the operation to read data from said dual-port SRAM cell onto the first pair of differential bit lines.

10. The memory device of claim 7, wherein said first clipping circuit comprises:
    first and second pull-up transistors having gate terminals responsive to a first write control signal;
    a first diode having an anode electrically coupled to a drain terminal of said first pull-up transistor and a cathode electrically coupled to a first one of the first pair of differential bit lines; and
    a second diode having an anode electrically coupled to a drain terminal of said second pull-up transistor and a cathode electrically coupled to a second one of the first pair of differential bit lines.

11. A develop-level clipping circuit, comprising:
    a first block coupled to a power voltage, the first block configured to block the power voltage when a write control signal is activated and configured to supply the power voltage when the write control signal is deactivated; and
    a second block coupled between the first block and a bitline pair, the second block configured to clip a develop-level of the bitline pair when the power voltage is supplied through the first block,
    wherein the first block includes a first PMOS transistor and a second PMOS transistor, and the second block includes a third transistor and a fourth transistor;
    a first terminal of the first PMOS transistor and a first terminal of the second PMOS transistor are coupled to the power voltage, a gate terminal of the first PMOS transistor and a gate terminal of the second PMOS transistor- are coupled to each other and receive the write control signal, a second terminal of the first PMOS transistor and a second terminal of the second PMOS transistor are coupled to the first terminal of the third transistor and a first terminal of the fourth transistor, respectively; and a gate terminal of the third transistor and a gate terminal of the fourth transistor are directly connected to a bit line and a complement bit line, respectively, if the third and fourth transistors are each PMOS transistors or are directly connected to the second terminal of the first PMOS transistor and the second terminal of the second POS transistor, respectively, if the third and fourth transistors are each NMOS transistors.

12. The develop-level clipping circuit of claim 11, wherein the develop-level of the bitline pair is determined according to sizes of transistors in the first block and the second block.

13. The develop-level clipping circuit of claim 11, wherein the develop-level of the bitline pair is clipped by the third transistor and the fourth transistor when the first PMOS transistor and the second PMOS transistor are turned on as the write control signal is deactivated, and the develop-level of the bitline pair is not clipped by the third transistor and the fourth transistor when the first PMOS transistor and the second PMOS transistor are turned off as the write control signal is activated.

14. The develop-level clipping circuit of claim 11, wherein a second terminal of the third transistor and a second terminal of the fourth transistor are coupled to the bitline of the bitline pair and the complementary bitline of the bitline pair, respectively.

* * * * *